United States Patent
Kodaira

(10) Patent No.: US 8,933,554 B2
(45) Date of Patent: Jan. 13, 2015

(54) SEMICONDUCTOR DEVICE AND METHOD FOR MANUFACTURING SEMICONDUCTOR DEVICE

(75) Inventor: Yoshihiro Kodaira, Matsumoto (JP)

(73) Assignee: Fuji Electric Co., Ltd., Kawasaki-shi, Kanagawa (JP)

( * ) Notice: Subject to any disclaimer, the term of this patent is extended or adjusted under 35 U.S.C. 154(b) by 15 days.

(21) Appl. No.: 13/978,323

(22) PCT Filed: Jun. 11, 2012

(86) PCT No.: PCT/JP2012/064946
§ 371 (c)(1),
(2), (4) Date: Jul. 11, 2013

(87) PCT Pub. No.: WO2013/015031
PCT Pub. Date: Jan. 31, 2013

(65) Prior Publication Data
US 2013/0285231 A1    Oct. 31, 2013

(30) Foreign Application Priority Data
Jul. 28, 2011    (JP) ................................. 2011-165056

(51) Int. Cl.
| | |
|---|---|
| H01L 23/10 | (2006.01) |
| H01L 23/34 | (2006.01) |
| H01L 25/07 | (2006.01) |
| H01L 25/18 | (2006.01) |
| H01L 23/36 | (2006.01) |
| H01L 23/498 | (2006.01) |
| H01L 23/053 | (2006.01) |

(52) U.S. Cl.
CPC ................ *H01L 23/10* (2013.01); *H01L 23/34* (2013.01); *H01L 25/07* (2013.01); *H01L 25/18* (2013.01); *H01L 23/36* (2013.01); *H01L 23/49811* (2013.01); *H01L 23/053* (2013.01); *H01L 2924/0002* (2013.01)
USPC ........... 257/693; 257/584; 257/678; 361/773; 438/125

(58) Field of Classification Search
CPC ... H01L 23/10; H01L 23/34; H01L 23/49811; H01L 23/36; H01L 23/053; H01L 25/07; H01L 25/18; H01L 2924/0002; H01L 2924/00
USPC ........... 257/584, 678, 693; 361/773; 438/125
See application file for complete search history.

(56) References Cited

U.S. PATENT DOCUMENTS

| | | | |
|---|---|---|---|
| 6,597,585 B2 | 7/2003 | Ferber et al. | |
| 8,134,838 B2 * | 3/2012 | Essert et al. | ................... 361/730 |
| 8,519,265 B2 * | 8/2013 | Nakao et al. | .................... 174/59 |

FOREIGN PATENT DOCUMENTS

| | | |
|---|---|---|
| JP | H05-15445 U | 2/1993 |
| JP | 2007-073782 A | 3/2007 |

(Continued)

*Primary Examiner* — Peniel M Gumedzoe
(74) *Attorney, Agent, or Firm* — Manabu Kanesaka

(57) ABSTRACT

A semiconductor device has an insulation substrate formed with a conductive pattern; an independent terminal, which is an externally leading terminal, soldered to the conductive pattern of the insulation substrate; a case disposed over the insulation substrate such that a top surface of the independent terminal is exposed; an opening provided on a side surface of the case; a nut glove inserted from the opening so as to be below the independent terminal, and fix the independent terminal; and a first projection part formed on a side surface of the nut glove, and having tapers in a frontward direction and a rearward direction of insertion of the nut glove, respectively. The rearward taper of the first projection part is pressure contacting with a sidewall surface of the opening.

5 Claims, 11 Drawing Sheets

(56) References Cited

FOREIGN PATENT DOCUMENTS

| JP | 2008-091787 A | 4/2008 |
| JP | 2009-081255 A | 4/2009 |
| JP | 2010-165764 A | 7/2010 |
| JP | 2011-066255 A | 3/2011 |

* cited by examiner (a)

SEMICONDUCTOR DEVICE AND METHOD FOR MANUFACTURING SEMICONDUCTOR DEVICE

RELATED APPLICATIONS

The present application is National Phase of International Application No. PCT/JP2012/064946 filed Jun. 11, 2012, and claims priority from Japanese Applications No. 2011-165056 filed Jul. 28, 2011.

TECHNICAL FIELD

This invention relates to a semiconductor device having a nut glove and an independent terminal, and a method for manufacturing a semiconductor device.

BACKGROUND ART

In recent years, in mounting of an IGBT module, the integration density has been increasing. When an externally leading terminal of a package is mounted on a conductive pattern-bearing insulation substrate, there are demands for the junction strength between the externally leading terminal and the conductive pattern-bearing insulation substrate, and the reliability of the junction part thereof. Further, when the externally leading terminal of the package is mounted on an insulation substrate including a conductive pattern (circuit pattern) formed thereon (which will be hereinafter referred to as a conductive pattern-bearing insulation substrate), there is also still another demand for the positional precision on the layout of the externally leading terminal.

The IGBT module is configured such that a conductive pattern-bearing insulation substrate is mounted on a heat radiation base plate, and such that an externally leading terminal and a semiconductor chip are soldered on the conductive pattern-bearing insulation substrate. As the externally leading terminal to be soldered onto the conductive pattern of the conductive pattern-bearing insulation substrate, there is often used an independent terminal not fixed to a resin case. Whereas, when an external wire and an independent terminal are electrically connected, there is used a nut glove formed of a resin body in which a nut is fitted into a nut receiving part (see e.g., the following Patent Documents 1 to 3).

Then, a configuration of a related-art IGBT module will be described. FIGS. 12A and 12B are each an explanatory view showing the configuration of a related art IGBT module. FIG. 12A is a plan view of the essential part of the related art IGBT module 500 as seen from the top surface thereof. FIG. 12B is an essential part side cross-sectional view cut along line X-X of the IGBT module 500 of FIG. 12A as seen from the direction of an arrow orthogonal to the line X-X. In the IGBT module and each member forming the IGBT module, the top surface is on the resin case side, and the bottom surface is on the heat radiation base plate side.

FIGS. 13A to 13C are each an explanatory view showing the configuration of the nut glove of FIGS. 12A and 12B. FIG. 13A is a plan view of an essential part of a nut glove 58 as seen from the top surface thereof. FIG. 13B is a side view of the essential part of the side surface of the nut glove 58 of FIG. 13A as seen from the direction of an arrow P orthogonal to the line X-X. FIG. 13C is an enlarged perspective view of a projection part 60 provided on each side surface of the nut glove 58. FIG. 14 is a cross sectional view showing an essential part of the independent terminal soldered on the conductive pattern-hearing insulation substrate. FIG. 14 is a cross sectional view of the side surface of the IGBT module 500 shown in FIGS. 12A and 12B as seen from the direction of an arrow K in parallel to the line X-X.

In assembly of the related-art IGBT module 500, first, a conductive pattern-bearing insulation substrate 53 is soldered on a heat radiation base plate 51. Then, an independent terminal 55 is soldered on the conductive pattern of the conductive pattern-bearing insulation substrate 53. Then, a resin case 56 is put in such a manner that the top surface of the independent terminal 55 is exposed outside the resin case 56. Thus, the bottom of a sidewall 56a of the resin case 56 is bonded to the periphery of the heat radiation base plate 51. Then, the nut glove 58 is inserted and set (below, provided in an inserted manner) through an opening 57 formed in the resin case 56 so as to lie under the independent terminal 55. The opening 57 is formed in the sidewall 56a and a partition plate 62 in the resin case 56. The nut glove 58 is a resin body in which a nut 58a is fitted into a nut receiving part 58c provided on the top surface, and is in the shape of a rectangular parallelepiped (in the shape of a rod). The nut 58a fitted in the nut receiving part 58c is vertically movable in the nut receiving part 58c.

The independent terminal 55 is in an inverted U shape in cross section as shown in FIG. 14. In the top (the bottom of the U shape) exposed outside the resin case 56, there is formed a mounting hole 55a to be mounted to an external wire. Whereas, the two legs (the opening ends of the U shape) of the independent terminal 55 are soldered to the conductive pattern-bearing insulation substrate 53. Further, a control terminal is also soldered to the conductive pattern-bearing insulation substrate 53.

The nut glove 58 is provided so that the nut glove 58 lies in the U-shaped hole of the independent terminal 55, and so that the nut 58a is situated immediately under the mounting hole 55a formed in the independent terminal 55. Each side surface 58b in parallel to the line X-X of the nut glove 58 is provided with a projection part 60 for fixing the nut glove 58 to the resin case 56. This results in a structure in which the projection part 60 prevents the nut glove 58 from coming out of the resin case 56.

The projection part 60 is, as shown in FIG. 13C, in the shape of a trapezoidal prism with a taper 61 in the direction of insertion of the nut glove 58 shown by an arrow N, and is structured to be easily inserted into the resin case 56. Incidentally, the size of the projection part 60 is several millimeters at the bottom thereof, and the height of the projection part 60 is at the order of 0.1 mm. The bottom of the projection part 60 is a portion contacting with the side surface 58b of the nut glove 58. The height of the projection part 60 is the length projecting from the side surface 58b of the nut glove 58 in the direction perpendicular to the side surface 58b of the nut glove 58.

Patent Document 1: Japanese Patent Application Publication No. 2008-091787
Patent Document 2: U.S. Pat. No. 6,597,585
Patent Document 3: Japanese Utility Model Application Publication No. H5-15445

However, as shown in FIG. 13C, in the related-art nut glove 58, the rear end face 60a of the projection part 60 is perpendicular to the side surface 58b of the nut glove 58. The rear end surface 60a of the projection part 60 is the surface rearward in the direction of insertion of the nut glove 58, and is the surface opposite to the surface with the taper 61. Accordingly, after fitting the nut glove 58 into the resin case 56, a clearance T of about 0.3 mm is created between the rear end face 60a of the projection part 60 and the wall surface 62a of the partition plate 62. As a result, the nut glove 58 cannot be fixed to the resin case 56 so as not to be displaced from a prescribed position.

Therefore, when the clearance T occurs between the rear end face 60a of the projection part 60 and the wall surface 62a of the partition plate 62, the nut glove 58 moves rearward in the direction of insertion thereof (in the direction opposite to the direction of insertion thereof). This makes difficult the alignment between the nut 58a of the nut glove 58 and the mounting hole 55a of the independent terminal 55. As a result, it becomes difficult to perform an operation of fixing an external wire (not shown) and the independent terminal 55 by a bolt by means of an automatic machine.

DISCLOSURE OF THE INVENTION

It is an object of this invention to provide a semiconductor device capable of aligning the position of a nut embedded in a nut glove with the position of a mounting hole provided in an independent terminal with high precision, and a method for manufacturing the semiconductor device in order to solve the problem by the foregoing related-art technology.

In order to solve the foregoing problem, and to attain the object of the present invention, a semiconductor device in accordance with this invention has the following features. On an insulation substrate, there is formed a conductive pattern. To the conductive pattern of the insulation substrate, there is soldered an independent terminal which is an externally leading terminal. A case is placed over the conductive pattern-bearing insulation substrate such that a top surface of the independent terminal is exposed. An opening is provided on a side surface of the case. A nut glove is inserted through the opening so as to lie under the independent terminal, thereby fixing the independent terminal. On a side surface of the nut glove, there is formed a first projection part having tapers in a forward direction and a rearward direction of insertion of the nut glove, respectively. The rearward taper of the first projection part is pressure contacting with a sidewall surface of the opening.

Further, in the semiconductor device in accordance with this invention, in the foregoing invention, desirably, a step which is wider on the insulation substrate side is formed on the sidewall surface of the opening, a second projection part is formed on a surface of the step, and a rear end of the nut glove is pressure contacting with the second projection part.

Still further, in the semiconductor device in accordance with this invention, in the foregoing invention, it is desirable that the nut glove is a resin body embedded with a nut for fixing the independent terminal and an external wire.

Furthermore, in order to solve the foregoing problem, and to attain the object of the present invention, a method for manufacturing a semiconductor device in accordance with this invention has the following features. First, a first soldering jig is mounted on a heat radiation base plate, and after mounting a first solder to a first opening of the first soldering jig, an insulation substrate including a conductive pattern formed thereon is mounted on the first solder. Then, a second soldering jig is mounted to the first opening of the first soldering jig, and after mounting a second solder and a third solder to a second opening and a third opening of the second soldering jig, respectively, a semiconductor chip is mounted on the second solder to the second opening, and an independent terminal in an inverted U shape is mounted on the third solder to the third opening such that an opening end of the U shape is on the insulation substrate side. Then, after melting the first solder, the second solder, and the third solder, cooling and solidification thereof are performed. Accordingly, the insulation substrate is solder bonded to the heat radiation base plate with the first solder, and the semiconductor chip and the independent terminal are solder bonded to the conductive pattern of the insulation substrate with the second solder and the third solder, respectively. Then, the first soldering jig and the second soldering jig are removed from the heat radiation base plate and the insulation substrate. Then, a case is placed over the heat radiation base plate such that a top surface of the independent terminal is exposed, and a sidewall of the case is bonded to the heat radiation base plate. Then, a nut glove is inserted through an opening of the sidewall of the case, and the nut glove and the case are fitted and fixed with a first projection and a second projection.

Further, in the method for manufacturing a semiconductor device in accordance with this invention, in the foregoing invention, it is desirable that the first soldering jig and the second soldering jig are each a jig formed of carbon, and the first solder, the second solder, and the third solder before melting are each a plate solder.

In accordance with this invention, a first projection part is formed on the side surface of the nut glove. The first projection part is tapered at the forward and rearward portions thereof with respect to the direction of insertion of the nut glove, respectively. The rearward taper of the first projection part is pressure contacting with an opening of a partition plate in the case. As a result, the nut glove can be fitted in the case. As a result, the nut of the nut glove and the mounding hole of the independent terminal can be aligned with each other with high precision.

Further, a second projection part is provided at the inlet of the opening of the case. The second projection part is pressure contacting with the top surface of the rear end of the nut glove. As a result, the nut glove and the case can be fixed with each other reliably.

The semiconductor device and the method for manufacturing the semiconductor device in accordance with the present invention produce an effect of enabling high precision alignment between the position of the nut embedded in the nut glove and the position of the mounting hole provided in the independent terminal.

BEST MODE FOR CARRYING OUT THE INVENTION

Figure 1:
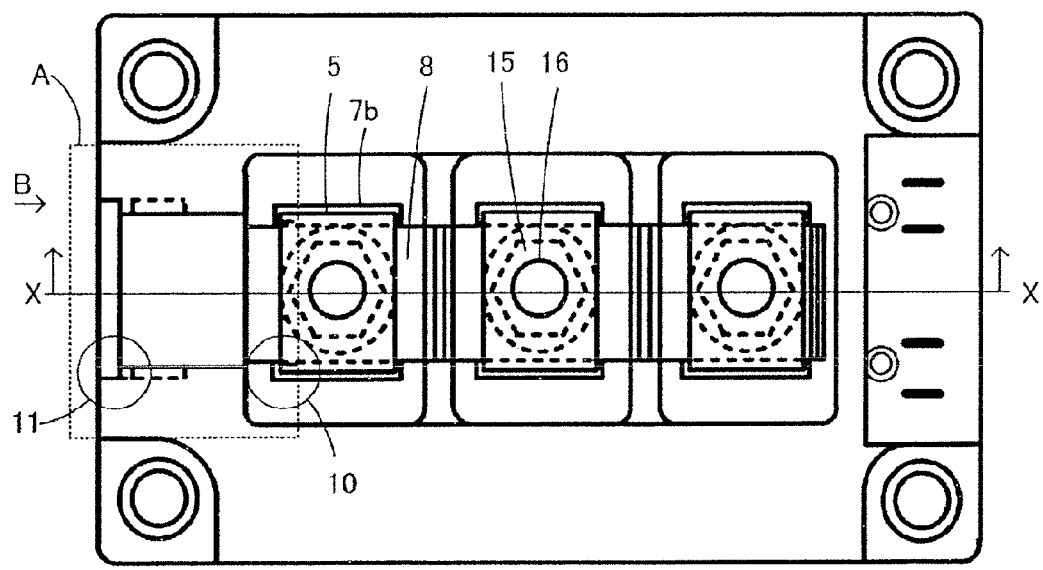
FIGS. 1A to 1C are each an explanatory view showing a configuration of a semiconductor device in accordance with Embodiment 1 of this invention.
Figure 1:
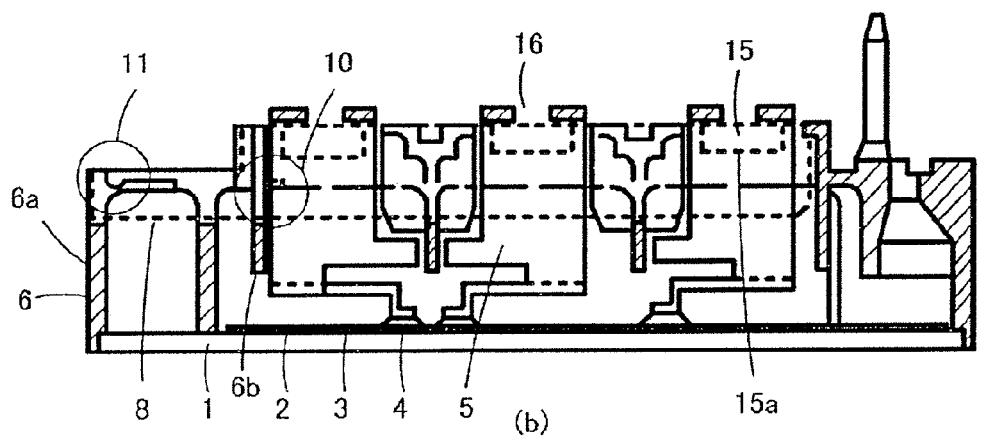
Figure 1:
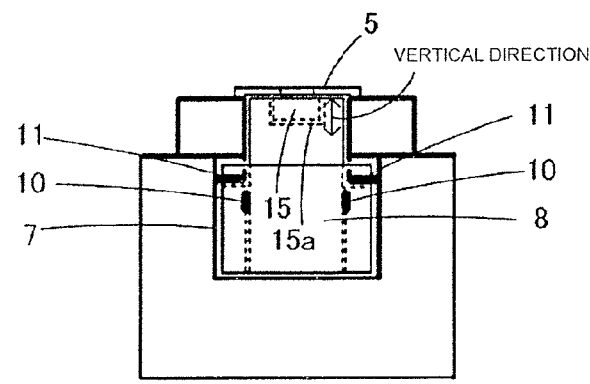

Below, referring to the accompanying drawings, a semiconductor device and a method for manufacturing the semiconductor device in accordance with this invention will be described in details by way of preferred embodiments. Incidentally, in the explanation of the following embodiments and the accompanying drawings, the same configurations are given the same reference numerals and signs, and an overlapping explanation thereon will be omitted.

Embodiment 1

FIGS. 1A to 1C are each an explanatory view showing a configuration of a semiconductor device in accordance with Embodiment 1 of this invention. FIG. 1A is a plan view of an essential part of a semiconductor device 100 as seen from the top surface thereof. FIG. 1B is a cross-sectional view of the essential part from a side cut along line X-X of the semiconductor device 100 of FIG. 1A as seen from the direction of an arrow orthogonal to the line X-X. FIG. 1C is a cross-sectional view of an A part (portion encircled by a dotted line) of the semiconductor device 100 of FIG. 1A as seen from the direction of an arrow B in parallel to the line X-X. The A part of the semiconductor device 100 is an area including an opening 7a formed in a sidewall 6a orthogonal to the line X-X of a resin case 6. Incidentally, in the side cross-sectional view of the semiconductor device 100 shown in FIG. 1B, a nut glove 8 is indicated with a dotted line.

Figure 2:
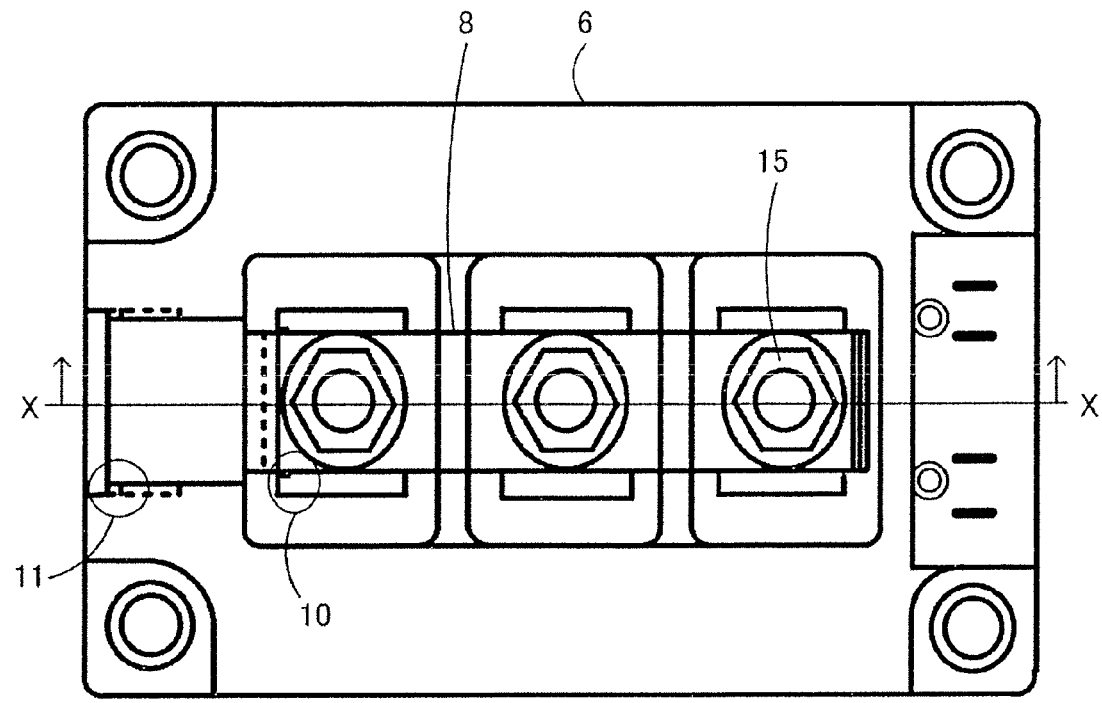
FIGS. 2A and 2B are each an explanatory view showing a configuration of a state in which a nut glove is inserted into a resin case of FIGS. 1A to 1C.
Figure 2:
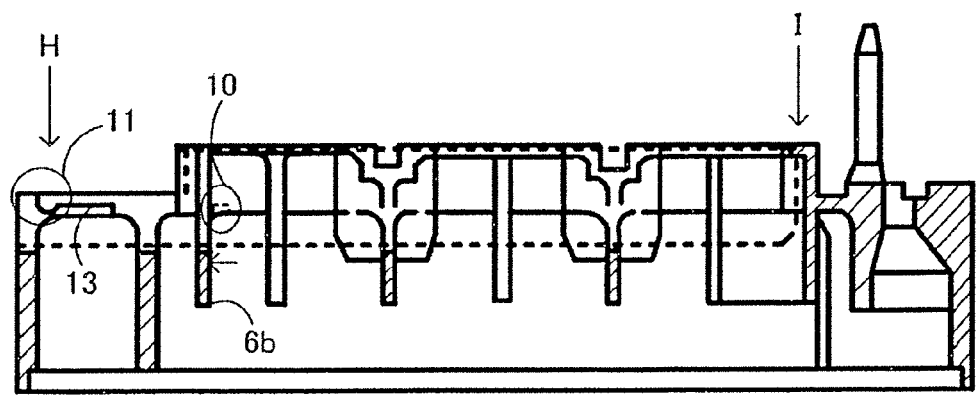

FIGS. 2A and 2B are each an explanatory view showing a configuration of a state in which the nut glove is inserted into the resin case of FIGS. 1A to 1C. FIG. 2A is a plan view of an essential part of the resin case 6 as seen from the top surface thereof. FIG. 2B is a cross-sectional view of the essential part from a side cut along line X-X of the resin case 6 of FIG. 2A as seen from the direction of an arrow orthogonal to the line X-X. In FIGS. 2A and 2B, the portion of the nut glove 8 hidden in the resin case 6 is indicated with a dotted line.

Figure 3:
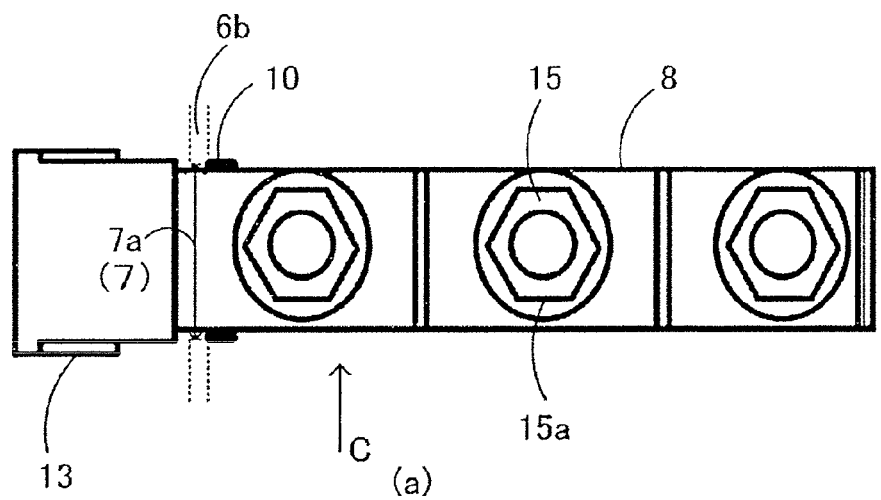
FIGS. 3A to 3C are each an explanatory view showing the nut glove of FIGS. 2A and 2B.
Figure 3:
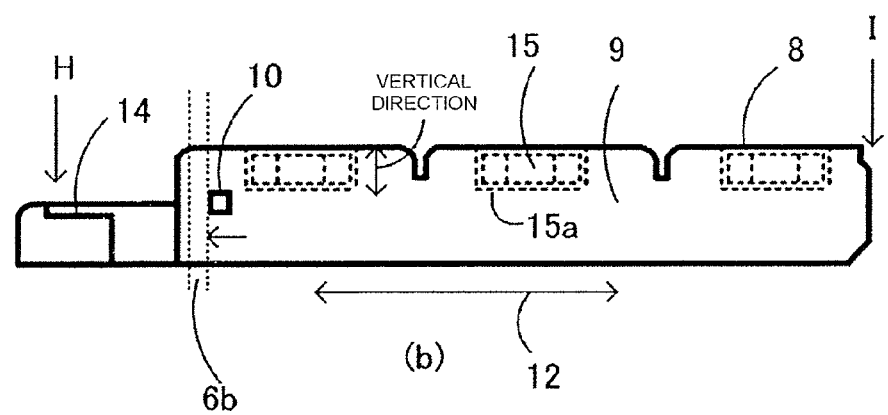
Figure 3:
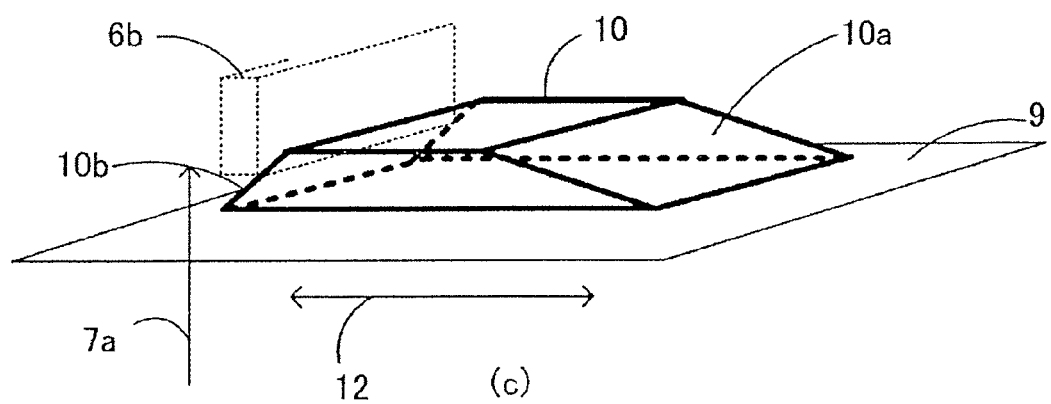

FIGS. 3A to 3C are each an explanatory view showing the nut glove of FIGS. 2A and 2B. FIG. 3A is a plan view of an essential part of the nut glove 8 as seen from the top surface thereof. FIG. 3B is a cross-sectional view of the essential part from a side of the side surface of the nut glove 8 of FIG. 3A as seen from the direction of an arrow C orthogonal to the line X-X. FIG. 3C is an essential part perspective view showing the shape of a first projection part 10 formed on each of opposite side surfaces of the nut glove 8.

Figure 4:
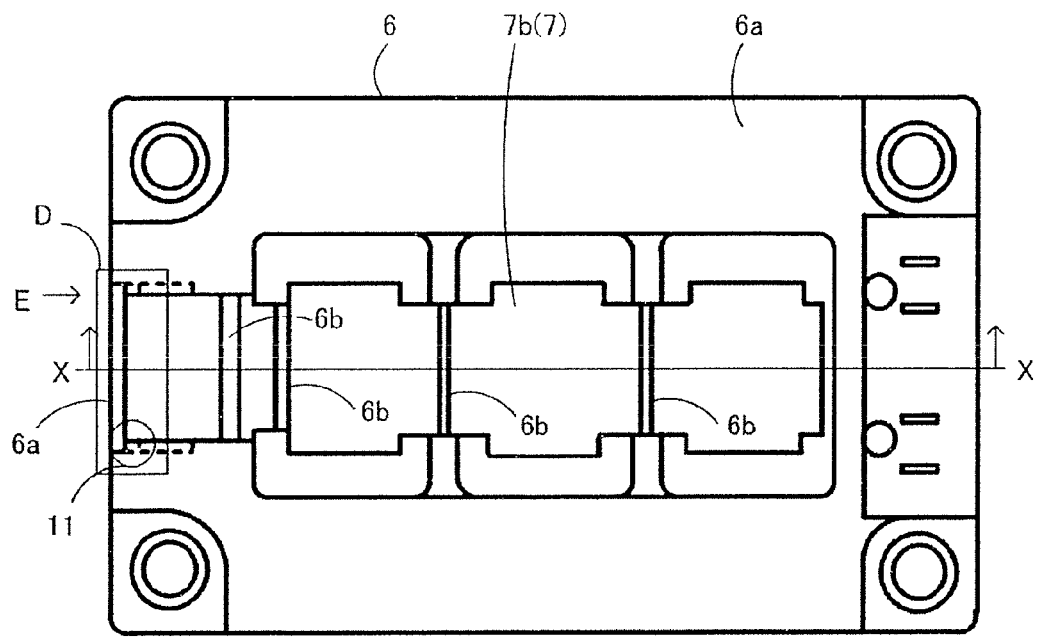
FIGS. 4A to 4D are each an explanatory view showing the resin case of FIGS. 1A to 1C.
Figure 4:
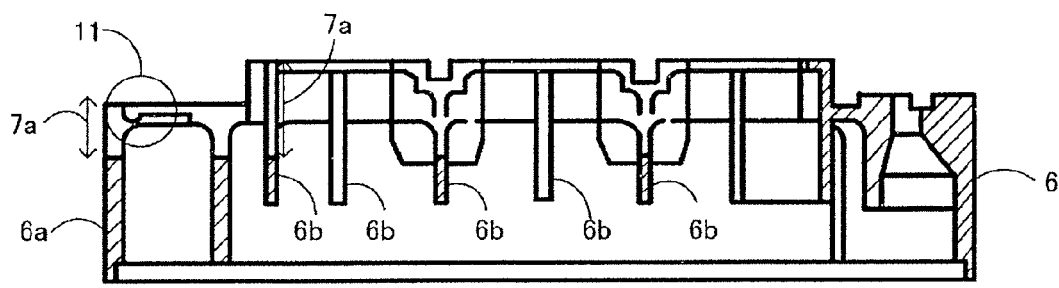
Figure 4:
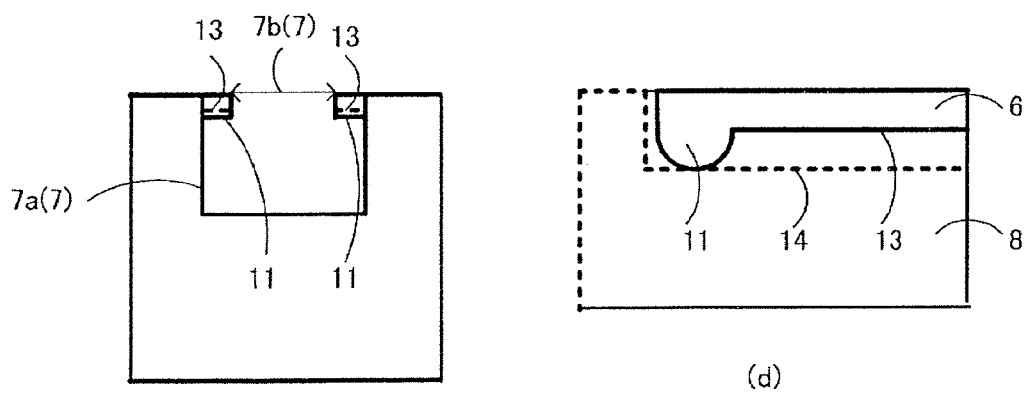

FIGS. 4A to 4D are each an explanatory view showing a configuration of the resin case of FIGS. 1A to 1C. FIG. 4A is a plan view of an essential part of the resin case 6 as seen from the top surface thereof. FIG. 4B is a cross-sectional view of the essential part from a side of the resin case 6 of FIG. 4A cut along the line X-X as seen from the direct on of an arrow orthogonal to the line X-X. FIG. 4C is a cross-sectional view of an essential part of a D part (portion encircled by a rectangular frame) of the resin case 6 of FIG. 4A as seen from the direction of an arrow E in parallel to the line X-X. The D part of the resin case 6 is an area including the opening 7a formed in the sidewall 6a orthogonal to the line X-X of the resin case 6. FIG. 4D is a cross-sectional view of an essential part showing a configuration of a second projection part 11 formed at the opening 7a inlet formed in the sidewall 6a of the resin case 6 shown in FIG. 4B.

Figure 5:
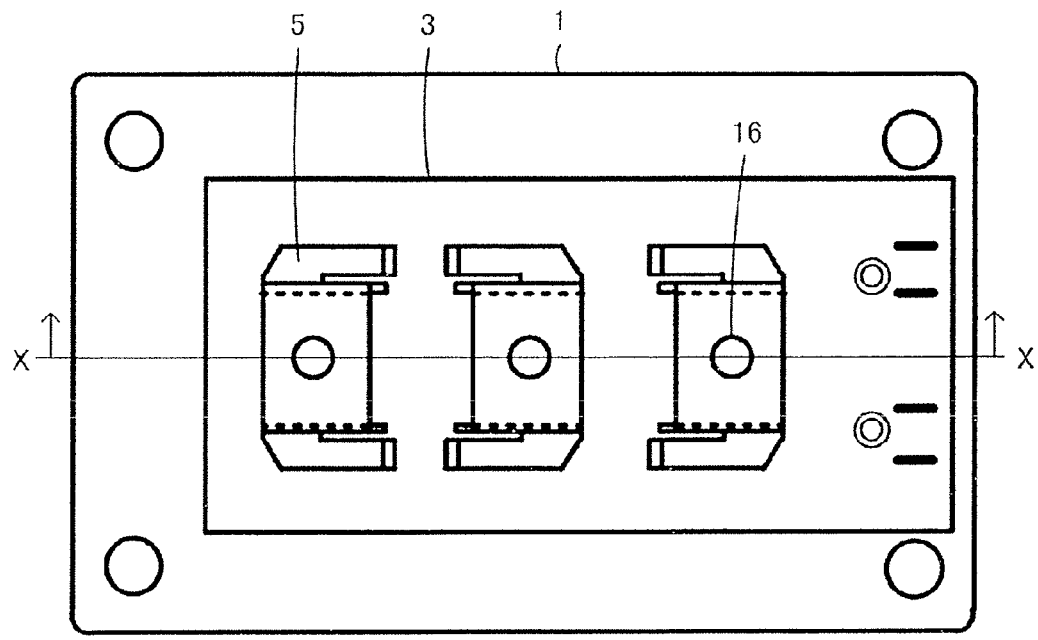
FIGS. 5A to 5C are each an explanatory view showing a configuration of an independent terminal soldered to a conductive pattern-bearing insulation substrate.
Figure 5:
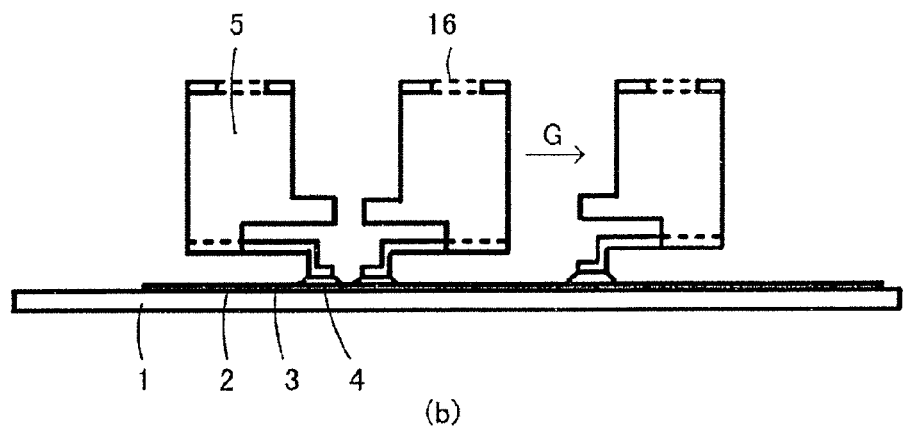
Figure 5:
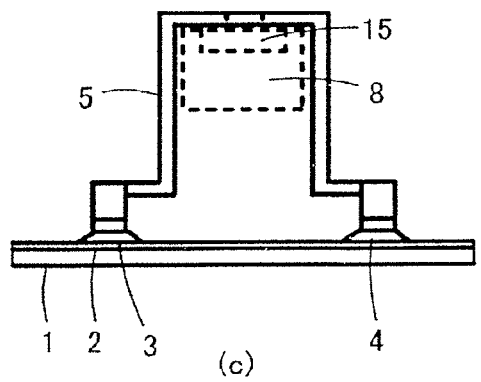

FIGS. 5A to 5C are each an explanatory view showing a configuration of the independent terminal soldered to the conductive pattern-bearing insulation substrate. FIG. 5A is a plan view of an essential part of the independent terminal 5 as seen from the top surface thereof. FIG. 5B is a cross-sectional view of the essential part from a side of the independent terminal 5 of FIG. 5A cut along the line X-X as seen from the direction of an arrow orthogonal to the line X-X. FIG. 5C is a cross-sectional view of the essential part of the independent terminal 5 of FIG. 5B as seen from the direction of an arrow G in parallel to the line X-X.

Referring to FIGS. 1A to 1C to FIGS. 5A to 5C, the semiconductor device 100 in accordance with Embodiment 1 will be described. The semiconductor device 100 is formed of a heat radiation base plate 1, a conductive pattern-bearing insulation substrate 3 (an insulation substrate including a conductive pattern (circuit pattern) formed thereon), and the independent terminal 5, the resin case 6, and the nut glove 8. The bottom surface of the conductive pattern-bearing insulation substrate 3 is bonded to the top surface of the heat radiation base plate 1 via a solder 2. The independent terminal 5 is bonded to the conductive pattern formed on the top surface of the conductive pattern-bearing insulation substrate 3 via a solder 4. The independent terminal 5 has an inverted U shape in cross section.

The resin case 6 is bonded to the periphery of the heat radiation base plate 1 in such a manner as to cover the top surface of the conductive pattern-bearing insulation substrate 3. The top surface of the independent terminal 5 is exposed at the top surface of the resin case 6. The nut glove 8 is inserted from the side surface (sidewall 6a) of the resin case 6 into the opening 7 of the resin case 6, thereby to fix the lateral position of the independent terminal 5. The nut glove 8 is a resin body of a structure in which a nut receiving part 15a is formed at the top surface, and a nut 15 made of, for example, a metal is fitted into the nut receiving part 15a. The nut 15 is in a state being movable vertically in the nut receiving part 15a.

The opening 7 of the resin case 6 includes the opening 7a in the side surface of the resin case 6, and an opening 7b in the top surface of the resin case 6 connecting with the opening 7a. The nut glove 8 is inserted into the opening 7 of the resin case 6 to such a degree that the front end (the end forward in the direction of insertion) of the nut glove 8 reaches the sidewall 6a facing the sidewall 6a including the opening 7a formed therein of the resin case 6. Further, when the nut glove 8 is inserted into the opening 7, the rear end (the end rearward in the direction of insertion) of the nut glove 8 is exposed from the opening 7a in the side surface of the resin case 6, and from the opening 7b in the top surface of the resin case 6, the top surface of the nut glove 8 is exposed.

Further, the opening 7 is also formed in a partition plate 6b which is the beam in the resin case 6 other than being formed in the sidewall 6a of the resin case 6. The sidewall surfaces of the opening 7 are surfaces facing the nut glove 8, and denote the sidewall 6a surface of the resin case 6 and the sidewall surface of the partition plate 6b. The sidewall 6a surface of the resin case 6 and the partition plate 6b formed in the inside of the resin case 6 are simultaneously formed by resin forming. On each side surface 9 in parallel to the line X-X of the nut glove 8, the first projection part 10 is formed as shown in FIGS. 3A to 3C. On the bottom surface of the resin case 6 in the vicinity of the opening 7a in the sidewall 6a, the second projection part 11 is formed as shown in FIGS. 2A and 2B. The bottom surface of the resin case 6 is the surface facing the conductive pattern-bearing insulation substrate 3.

As shown in FIG. 3C, in the longitudinal direction (the direction in parallel to the line X-X) 12 of the nut glove 8, a first taper 10a and a second taper 10b are formed at the front end face and the rear end face of the first projection part 10, respectively. When the nut glove 8 is inserted into the opening 7 of the resin case 6, the second taper 10b formed at the rearward part of the first projection part 10 in the direction of insertion is pressure contacting with, and engaged with (fixed to) the sidewall surface of the opening 7 (the sidewall surface of the partition plate 6b) of the resin case 6 facing the first projection part 10. As a result, the nut glove 8 is fixed to the resin case 6.

Further, as shown in FIGS. 4A to 4D, the second projection part 11 is formed on the bottom surface of the resin case 6 in the vicinity of the opening 7 (a stepped surface 13 formed at the sidewall surface of the opening 7 so as to be wider on the bottom side). For this reason, when the nut glove 8 of FIGS. 3A to 3C is inserted into the opening 7 of the resin case 6, a stepped surface 14 formed at the top surface of the rear end of the nut glove 8 is pressed against the second projection part 11. As a result, the nut glove 8 is fixed to the resin case 6. With this configuration, at the two sites (two-point load) of arrows H and I (the top surface of the rear end and the top surface of the front end of the nut glove 8) of FIG. 2B, the nut glove 8 is pressed against and fixed to the partition plate 6b of the resin case 6.

Figure 13:
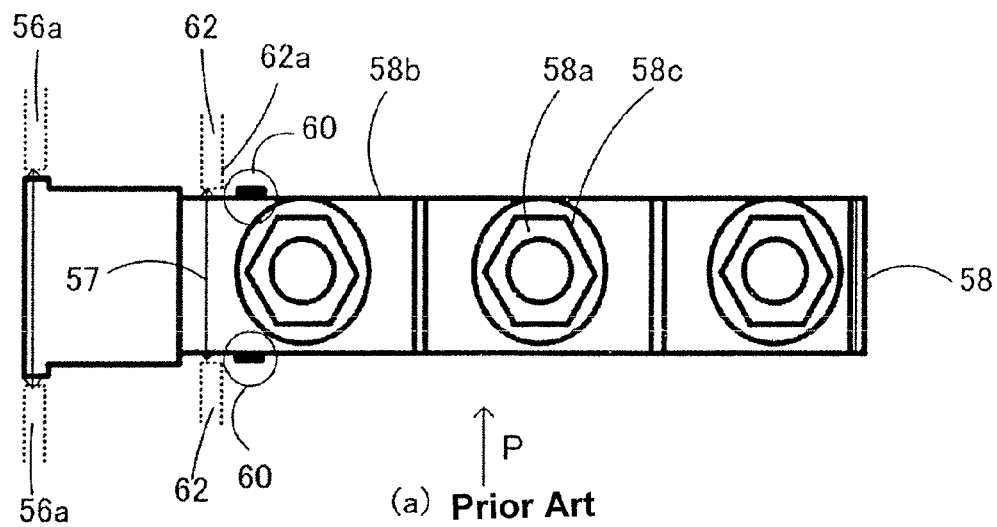
FIGS. 13A to 13C are each an explanatory view showing a configuration of a nut glove of FIGS. 12A and 12B.
Figure 13:
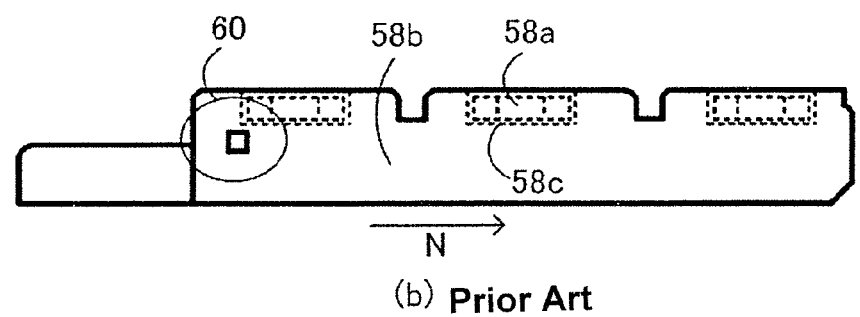
Figure 13:
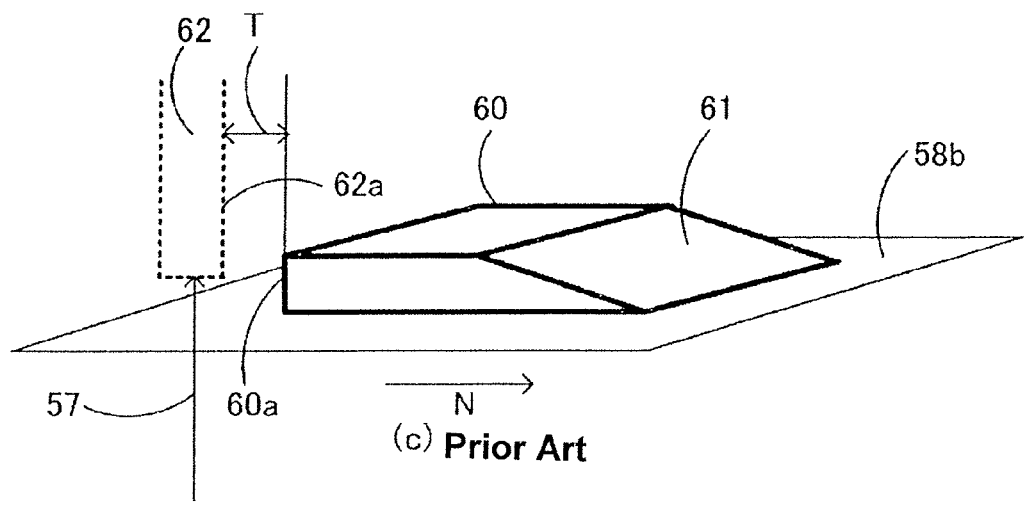
Figure 14:
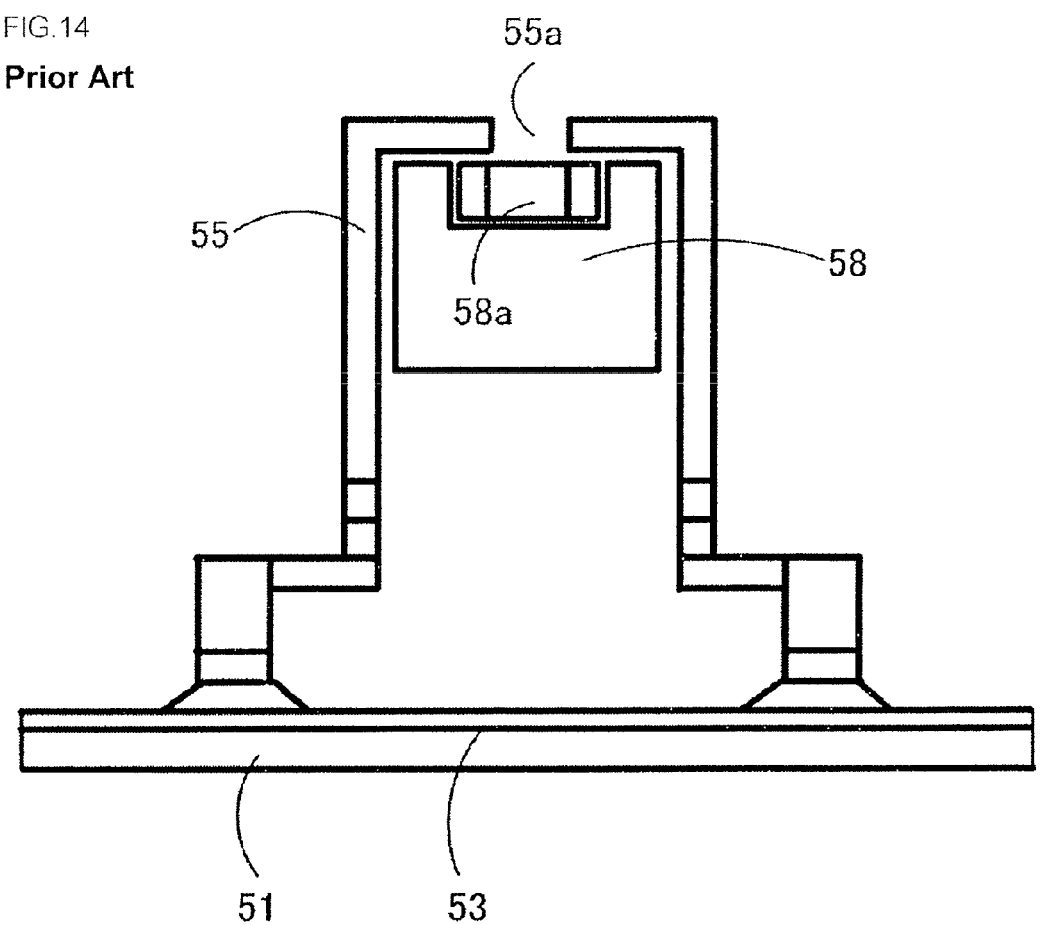
FIG. 14 is a cross-sectional view showing an essential part of the independent terminal soldered to the conductive pattern-bearing insulation substrate.

Thus, the nut glove 8 can be fixed to the resin case 6 in such a manner as to prevent the nut glove 8 from moving rearward in the direction of insertion. As a result, the shift between the position of the nut 15 of the nut glove 8 and the position of a mounting hole 16 of the independent terminal 5 can be made smaller by about 0.3 mm than that in the related art. This is because the clearance T caused between the rear end face of the projection part and the wall surface of the partition plate 62 in the related-art structure (see FIG. 13C) can be made zero.

The first projection parts 10 formed on both side surfaces 9 of the nut glove 8, and the second projection part formed on the resin case 6 side point contact or line contact with each other. Accordingly, the nut glove 8 is applied with a high compression load. The compression load corrects the warpage of the nut glove 8 caused upon resin forming. This results in an improvement of the alignment precision between the nut 15 and the mounting hole 16.

Further, the first projection parts 10 and the second projection part 11 firmly fix the nut glove 8 to the resin case 6. This prevents the nut glove 8 from falling off from the resin case 6.

Incidentally, in Embodiment 1, a description was given to the case where both of the first projection parts 10 and the second projection part 11 were provided as an example. However, even in the case of the configuration in which only any one of the projection part of the first projection part 10 or the second projection part 11 is provided, the nut glove 8 can be fixed to the resin case 6. Further, even when the first projection part 10 is formed only one side surface 9 of both the side surfaces 9 of the nut glove 8, the effects are produced.

Embodiment 2

Then, a manufacturing (assembly) method of the semiconductor device 100 in accordance with Embodiment 1 will be described as Embodiment 2. FIGS. 6 to 11 are each a cross-sectional view of an essential part manufacturing step showing a state of the semiconductor device during manufacturing thereof in accordance with Embodiment 2 of this invention. FIGS. 6 to 11 are cross-sectional views of essential part manufacturing steps sequentially showing the manufacturing steps of the semiconductor device. In FIGS. 6 to 11, the heat radiation base plate 1 and the conductive pattern-bearing insulation substrate 3 are shown with larger thicknesses than those in the case of FIG. 1B.

Figure 6:
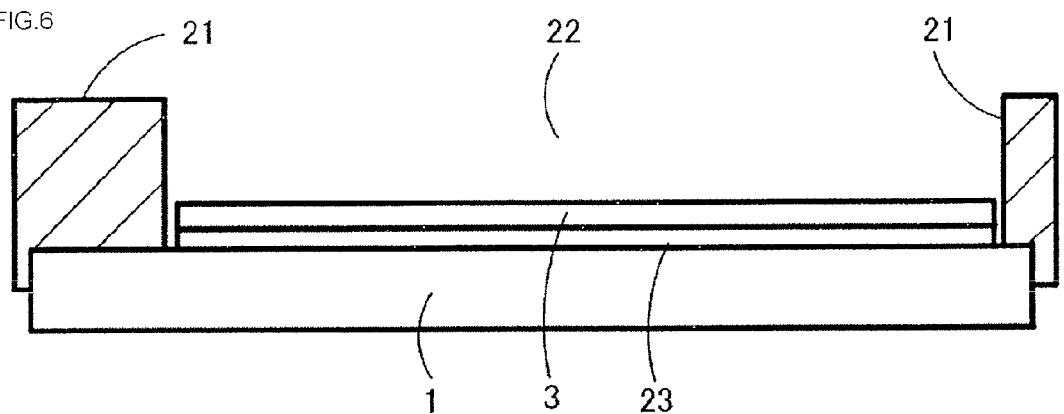
FIG. 6 is a cross-sectional view of an essential part manufacturing step showing a state of a semiconductor device during manufacturing thereof in accordance with Embodiment 2 of this invention.

First, on the top surface of the heat radiation base plate 1, a first soldering jig 21 is mounted so that the top surface of the heat radiation base plate 1 is selectively exposed. Further, on the top surface of the heat radiation base plate 1 exposed at a first opening 22 of the first soldering jig 21, there is mounted a first plate solder (first solder) 23. On the first plate solder 23, there is mounted the conductive pattern-bearing insulation substrate 3 (FIG. 6). The first soldering jig 21 is formed of carbon or the like.

Figure 7:
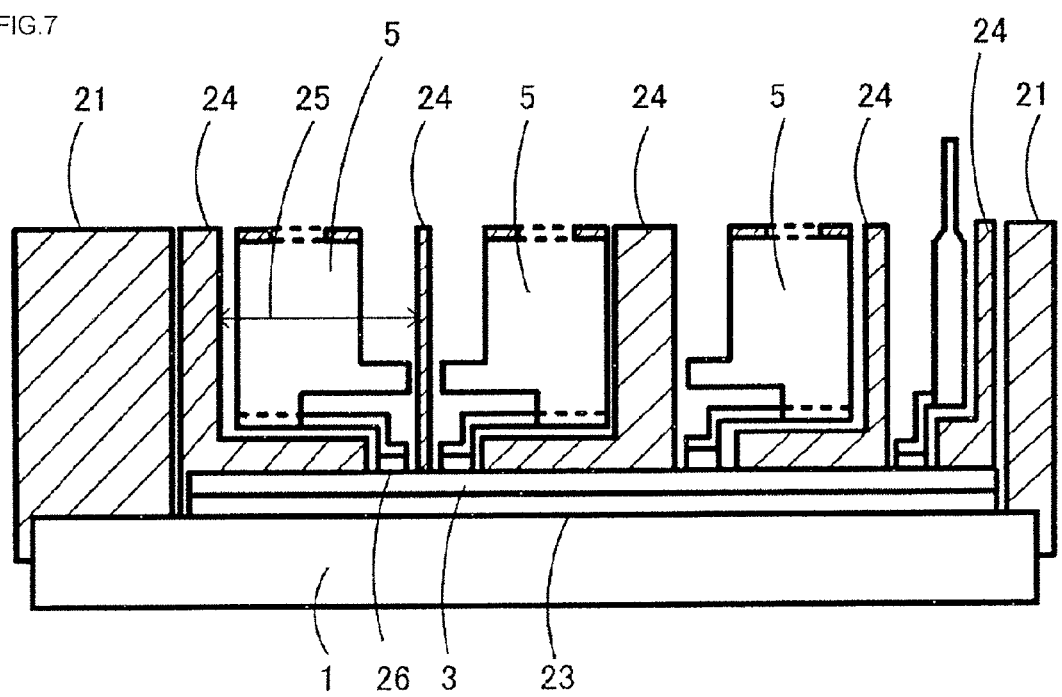
FIG. 7 is a cross-sectional view of an essential part manufacturing step showing a state of the semiconductor device during manufacturing thereof in accordance with Embodiment 2 of this invention following FIG. 6.

Then, on the top surface of the conductive pattern-bearing insulation substrate 3 exposed at the first opening 22 of the first soldering jig 21, a second soldering jig 24 is mounted so that the top surface of the conductive pattern-bearing insulation substrate 3 is selectively exposed. Further, on the top surface of the conductive pattern-bearing insulation substrate 3 exposed at a second opening 25 and a third opening not shown of the second soldering jig 24, there are mounted a second plate solder 26 (second solder) and a third plate solder (third solder) not shown, respectively. Then, on the second plate solder 26 of the second opening 25, there is mounted the independent terminal 5, and on the third plate solder of the third opening of the second opening 25, there is mounted a semiconductor chip not shown (FIG. 7). The second soldering jig 24 is formed of carbon or the like.

Figure 8:
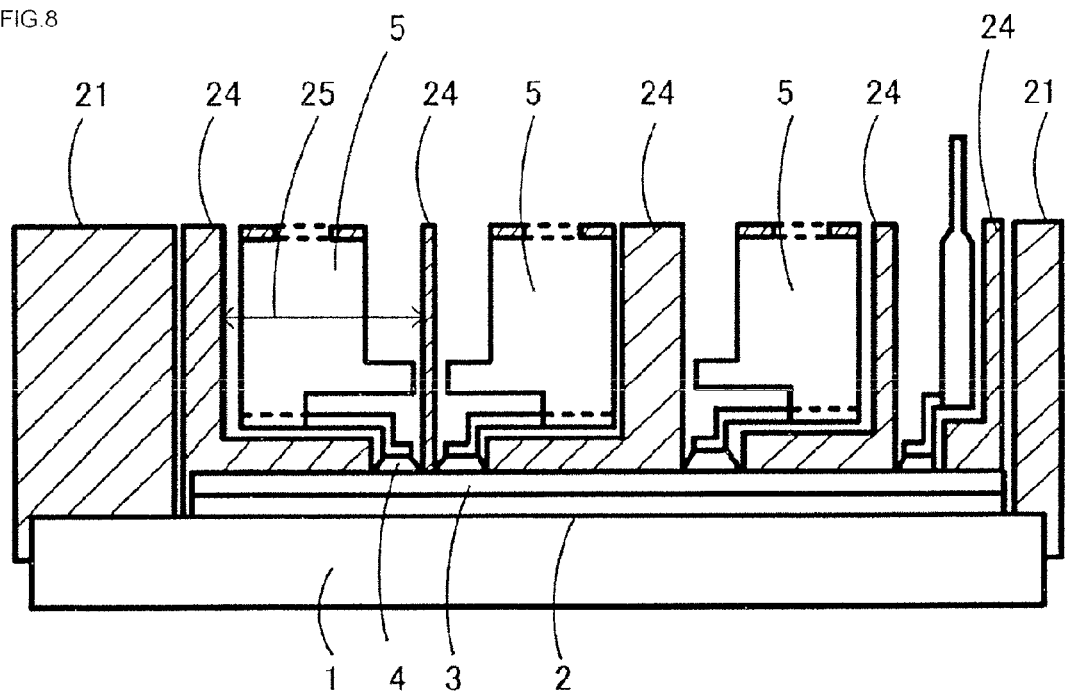
FIG. 8 is a cross-sectional view of an essential part manufacturing step showing a state of the semiconductor device during manufacturing thereof in accordance with Embodiment 2 of this invention following FIG. 7.

Then, the heat radiation base plate 1 mounting the conductive pattern-bearing insulation substrate 3, the independent terminal 5, and the semiconductor chip thereon is placed with the first and second soldering jigs 21 and 24 mounted thereon in, for example, a reflow furnace. Then, the first plate solder 23, the second plate solder 26, and the third plate solder not shown interposed between their respective members are molten. Then, the molten first to third plate solders are cooled. Thus, by a solder 2 resulting from solidification of the first plate solder, the bottom surface of the conductive pattern-bearing insulation substrate 3 is solder bonded to the top surface of the heat radiation base plate 1. By a solder 4 resulting from the solidification of the second and third plate solders, the independent terminal 5 and the semiconductor chip not shown are solder bonded to the conductive pattern formed on the top surface of the conductive pattern-bearing insulation substrate 3 (FIG. 8).

Figure 9:
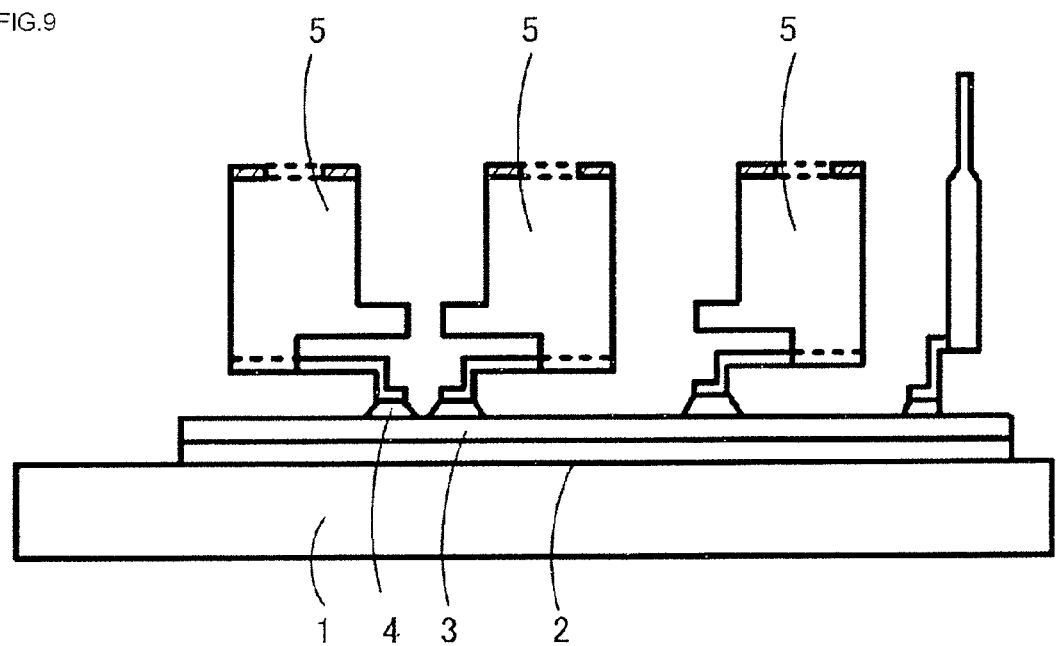
FIG. 9 is a cross-sectional view of an essential part manufacturing step showing a state of the semiconductor device during manufacturing thereof in accordance with Embodiment 2 of this invention following FIG. 8.
Figure 10:
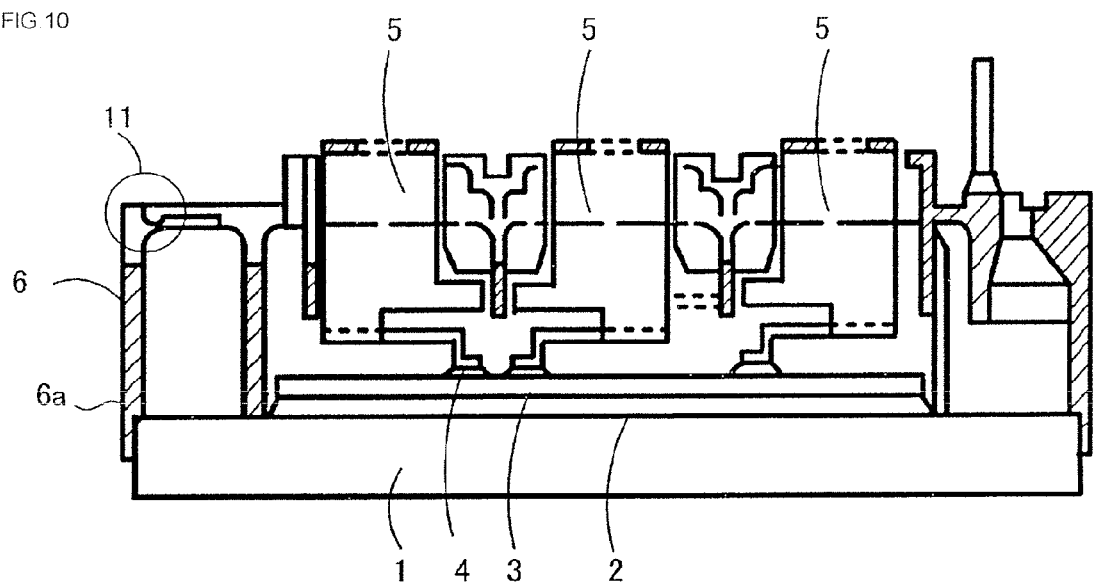
FIG. 10 is a cross-sectional view of an essential part manufacturing step showing a state of the semiconductor device during manufacturing thereof in accordance with Embodiment 2 of this invention following FIG. 9.

Then, the first soldering jig 21 and the second soldering jig 24 are removed from the heat radiation base plate and the conductive pattern-bearing insulation substrate 3 (FIG. 9). Then, the resin case 6 is put over the top surface side of the heat radiation base plate 1 so that the top surface of the independent terminal 5 is exposed; and the bottom of the sidewall 6a of the resin case 6 is bonded to the periphery of the heat radiation base plate 1 (FIG. 10).

Figure 11:
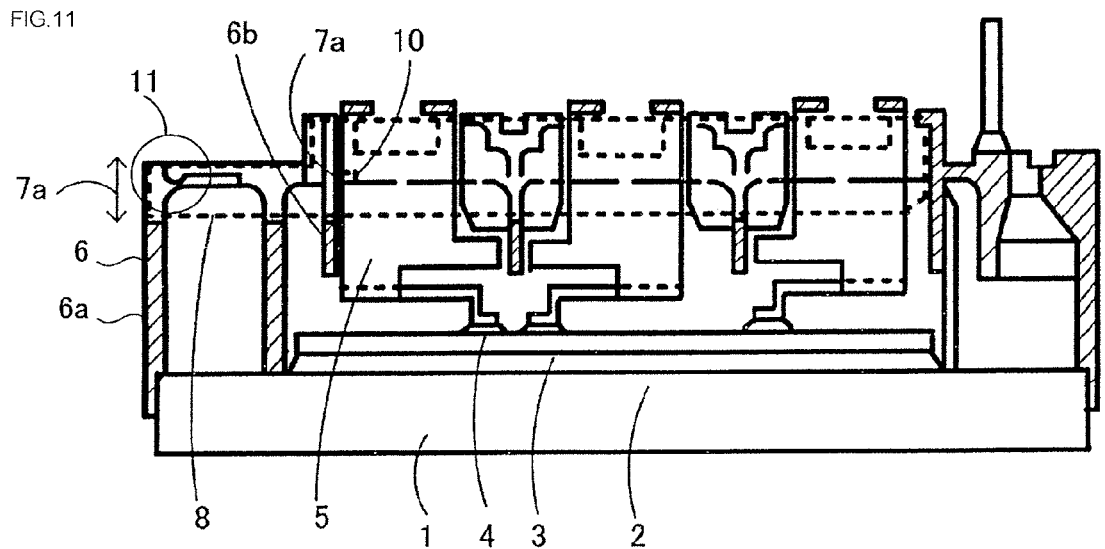
FIG. 11 is a cross-sectional view of an essential part manufacturing step showing a state of the semiconductor device during manufacturing thereof in accordance with Embodiment 2 of this invention following FIG. 10.
Figure 12:
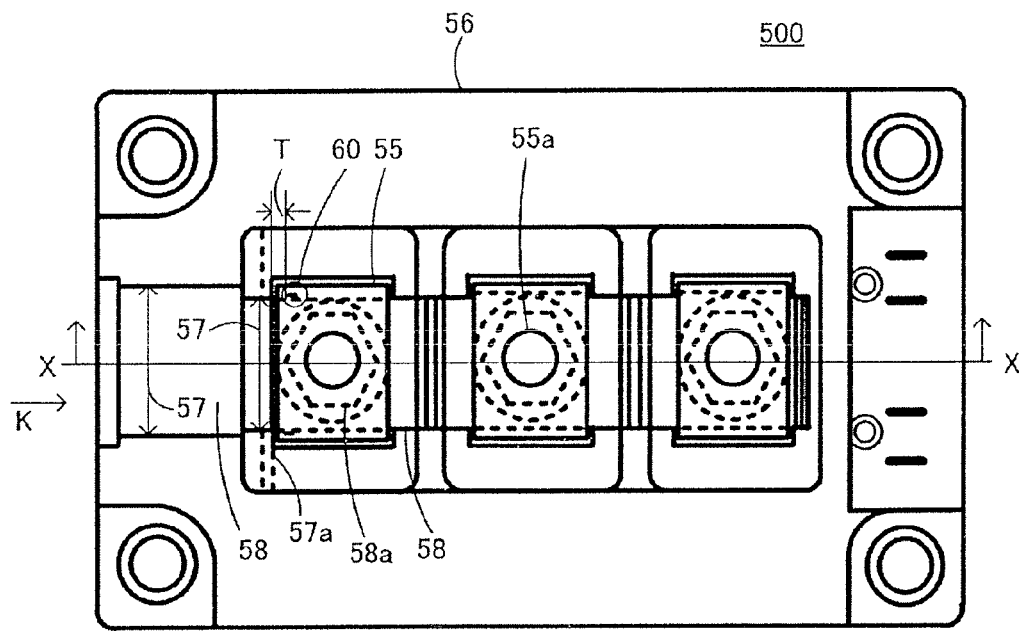
FIGS. 12A and 12B are each an explanatory view showing a configuration of a related-art IGBT module.
Figure 12:
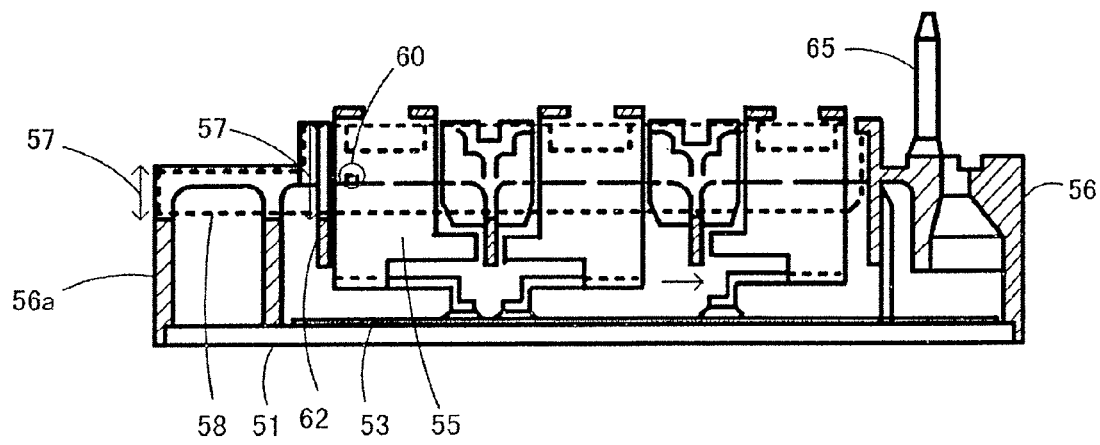

Then, the nut glove 8 is inserted through the opening 7a of the sidewall 6a of the resin case 6, and the nut glove 8 and the resin case 6 are fitted and fixed with each other by the first projection parts 10 and the second projection parts 11. At this step, as shown in FIG. 3C, the second taper 10b formed on the rear end face of each first projection part 10 is pressure contacting with the end of the opening 7a formed in the partition plate 6b in the resin case 6 (FIG. 11). As a result, the semiconductor device 100 shown in FIGS. 1A to 1C is completed.

EXPLANATION OF REFERENCE NUMERALS

1 Heat radiation base plate
2, 4 Solder
3 Conductive pattern-bearing insulation substrate
5 Independent terminal
6 Resin case
6a Sidewall of resin case
6b Partition plate
7 Opening (collective name)
7a Opening (formed in the sidewall and the partition plate of
the resin case)
7b Opening (formed in the top surface of the resin case)
8 Nut glove
9 Side surface of nut glove
10 First projection part
10a First taper
10b Second taper
11 Second projection part
13, 14 Stepped surface
15 Nut
15a Nut receiving part
16 Mounting hole
21 First soldering jig
22 First opening of first soldering jig
23 First plate solder
24 Second soldering jig
25 Second opening of second soldering jig
26 Second plate solder

What is claimed is:

1. A semiconductor device, comprising:
    an insulation substrate formed with a conductive pattern;
    an independent terminal, which is an externally leading terminal, soldered to the conductive pattern of the insulation substrate;
    a case disposed over the insulation substrate such that a top surface of the independent terminal is exposed;
    an opening provided on a side surface of the case;
    a nut glove, being inserted from the opening so as to be below the independent terminal, to fix the independent terminal; and
    a first projection part formed on a side surface of the nut glove, and having tapers in a frontward direction and a rearward direction of insertion of the nut glove, respectively,
    wherein the rearward taper of the first projection part is pressure contacting with a sidewall surface of the opening.

2. The semiconductor device according to claim 1, wherein the sidewall surface of the opening is formed with a step which is wider on an insulation substrate side, the stepped surface is formed with a second projection part, and a rear end of the nut glove is pressure contacting with the second projection part.

3. The semiconductor device according to claim 1, wherein the nut glove is a resin body embedded with a nut for fixing the independent terminal and an external wire.

4. A method for manufacturing a semiconductor device, comprising the steps of:
    mounting a first soldering jig on a heat radiation base plate, and after mounting a first solder to a first opening of the first soldering jig, mounting an insulation substrate formed with a conductive pattern on the first solder;
    mounting a second soldering jig on the first opening of the first soldering jig, and after mounting a second solder and a third solder on a second opening and a third opening of the second soldering jig respectively, mounting a semiconductor chip on the second solder of the second opening, and mounting an independent terminal in an inverted U shape on the third solder of the third opening such that an opening end of the U shape is on the insulation substrate side;
    cooling and solidifying, after melting the first solder, the second solder and the third solder, to solder bond the insulation substrate to the heat radiation base plate with the first solder, and solder bond the semiconductor chip and the independent terminal to the conductive pattern of the insulation substrate with the second solder and the third solder, respectively;
    removing the first soldering jig and the second soldering jig from the heat radiation base plate and the insulation substrate;
    placing a case over the heat radiation base plate such that a top surface of the independent terminal is exposed, and bonding a sidewall of the case to the heat radiation base plate; and
    inserting a nut glove from an opening of the sidewall of the case, and fitting and fixing the nut glove and the case with a first projection and a second projection.

5. A method for manufacturing a semiconductor device according to claim 4, wherein
    the first soldering jig and the second soldering jig are each a jig formed of carbon, and the first solder, the second solder, and the third solder before melting are each a plate solder.

* * * * *

UNITED STATES PATENT AND TRADEMARK OFFICE
CERTIFICATE OF CORRECTION

| | |
|---|---|
| PATENT NO. | : 8,933,554 B2 |
| APPLICATION NO. | : 13/978323 |
| DATED | : January 13, 2015 |
| INVENTOR(S) | : Yoshihiro Kodaira |

It is certified that error appears in the above-identified patent and that said Letters Patent is hereby corrected as shown below:

In the Specification

Please change column 6, line 6, "the direct of an arrow" to -- the direction of an arrow --.

Signed and Sealed this
Fifth Day of May, 2015

Michelle K. Lee
*Director of the United States Patent and Trademark Office*